United States Patent [19]

Zdebel et al.

[11] Patent Number: 5,028,559

[45] Date of Patent: Jul. 2, 1991

[54] FABRICATION OF DEVICES HAVING LATERALLY ISOLATED SEMICONDUCTOR REGIONS

[75] Inventors: Peter J. Zdebel, Mesa; Barbara Vasquez, Chandler, both of Ariz.

[73] Assignee: Motorola Inc., Schaumburg, Ill.

[21] Appl. No.: 327,632

[22] Filed: Mar. 23, 1989

[51] Int. Cl.[5] .................. H01L 21/205; H01L 21/285; H01L 21/308

[52] U.S. Cl. ........................................ 437/69; 437/70; 437/72

[58] Field of Search ........................... 437/69, 70, 72; 156/643

[56] References Cited

FOREIGN PATENT DOCUMENTS

| 0041242 | 3/1985 | Japan | 437/72 |
| 0085838 | 5/1986 | Japan | 437/69 |
| 0241941 | 10/1986 | Japan | 437/70 |
| 0015445 | 1/1988 | Japan | 437/69 |

OTHER PUBLICATIONS

Kure et al., "VLSI Device Fabrication Using a Unique, Highly-Selective $Si_3N_4$ Dry Etching", International Electron Devices Meeting, Washington, D.C., Dec. 1983.

Primary Examiner—Olik Chaudhuri
Assistant Examiner—Ourmazd S. Ojan
Attorney, Agent, or Firm—Harry A. Wolin

[57] ABSTRACT

A method of fabrication of a device having laterally isolated semiconductor regions. In a preferred embodiment, laterally isolated polysilicon features are created with vertical, nitride-sealed sidewalls. The nitride-sealed sidewalls formed using sidewall spacer technology eliminate oxide encroachment while further preventing the loss of dopant laterally during thermal processing. The final structure comprises polysilicon features flanked by either oxide isolation or additional polysilicon features and is planar without requiring a planarization etchback. The process is applicable to polysilicon electrodes over active areas as well as polysilicon resistors over isolation oxide.

27 Claims, 4 Drawing Sheets

FABRICATION OF DEVICES HAVING LATERALLY ISOLATED SEMICONDUCTOR REGIONS

BACKGROUND OF THE INVENTION

This invention relates, in general, to semiconductor devices, and more particularly to the fabrication of semiconductor devices having laterally isolated semiconductor regions.

Presently, a number of lateral isolation schemes of semiconductor regions are known in the art. However, there are typically problems with the existing schemes. For example, one such scheme employs a nitride mask having a window therein through which the semiconductor regions, commonly polysilicon, are oxidized. Major problems with using this method include a resulting non-planar device structure, a non-vertical polysilicon sidewall and the polysilicon dimensions vary considerably due to the variability in oxide encroachment.

In their paper entitled "Planarized Self-Aligned Double-Polysilicon Bipolar Technology", IEEE 1988 Bipolar Circuits and Technology Meeting, Appendix III, Paper 6.1, Drobny et al. teach a SWAMI modification of polysilicon oxidation through a nitride window. A nitride sidewall spacer reduces oxide encroachment. However, the final planarity of the resulting structure after oxidation is dependent upon etching through half of the polysilicon prior to nitride sidewall deposition and polysilicon oxidation. This is extremely difficult because the problem of controlling the etch so that it stops halfway through the deposited polysilicon thickness hinders reproducibility and manufacturability. Additionally, the sidewalls taught by this method are not sealed.

U.S. Pat. No. 4,659,428 entitled "Method of Manufacturing a Semiconductor Device and Semiconductor Device Manufactured by Means of the Method" issued to Maas et al. on Apr. 21, 1987 discloses another approach. In this patent, silicon feature separation is accomplished by a groove having a dimension which is determined by the differential oxidation rates of undoped and heavily doped polysilicon or silicon layers under low temperature, steam oxidation conditions. There is an absolute requirement for heavy doping of the polysilicon or monosilicon layer of interest. Differential oxidation (approximately a tenfold difference) between the heavily doped layer of interest and the undoped sacrificial polysilicon layer is the heart of the process concept.

The present invention discloses a method for the fabrication of a device having sealed, laterally isolated semiconductor regions which reduces or eliminates the problems disclosed above.

SUMMARY OF THE INVENTION

Accordingly, it is an object of the present invention to provide for the fabrication of a device having laterally isolated semiconductor regions wherein there is no encroachment into the semiconductor regions.

Another object of this invention is to provide for the fabrication of a device having laterally isolated semiconductor regions that may be scaled beyond photolithographically defined parameters.

It is an additional object of the present invention to provide for the fabrication of a device having laterally isolated semiconductor regions wherein the device has a planar finished structure.

Yet a further object of the present invention is to provide for the fabrication of a device having laterally isolated semiconductor regions wherein vertically insulating sidewalls prevent the loss of dopant laterally during thermal processing to flanking dielectric features.

The foregoing and other objects and advantages are achieved in the present invention by one embodiment in which, as a part thereof, provides a semiconductor substrate, forms semiconductor regions on the semiconductor substrate and forms insulating sidewalls that are impervious to impurities and oxidation to laterally insulate the semiconductor regions.

A more complete understanding of the present invention can be attained by considering the following detailed description in conjunction with the accompanying drawings.

DETAILED DESCRIPTION OF THE INVENTION

Figure 1:
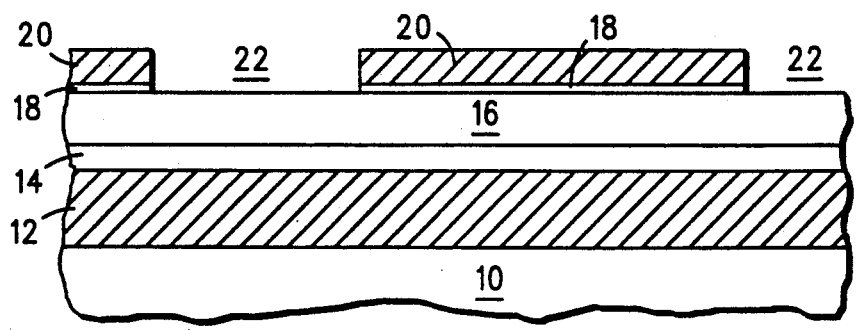
FIGS. 1-11 illustrate highly enlarged cross-sectional views of a portion of a semiconductor structure during processing.
Figure 2:
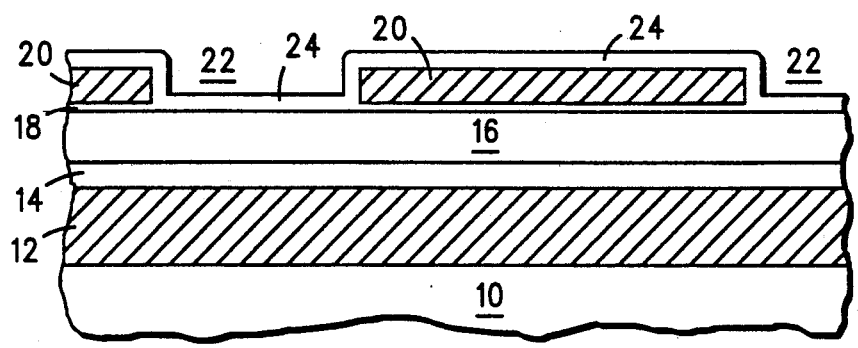
Figure 3:
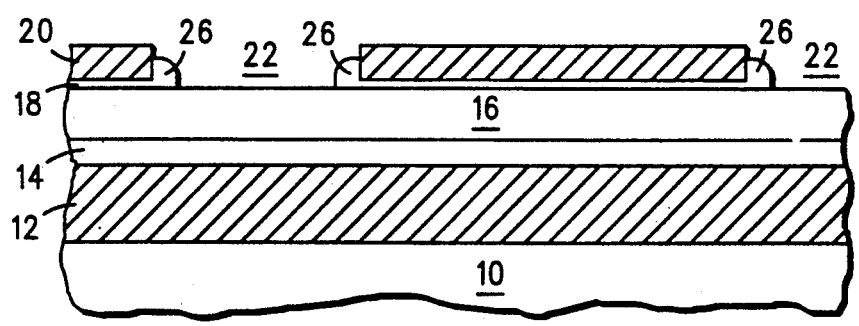
Figure 4:
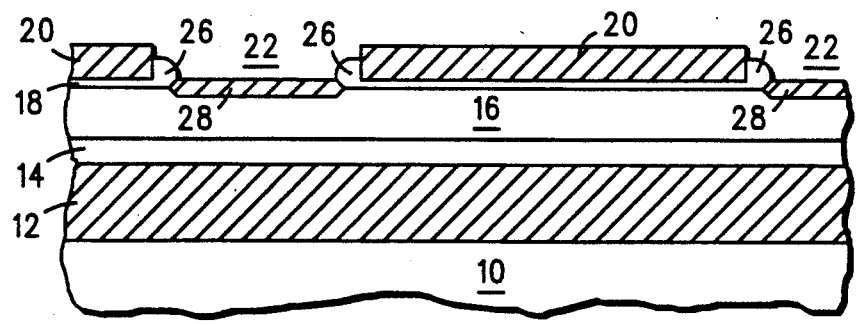
Figure 5:
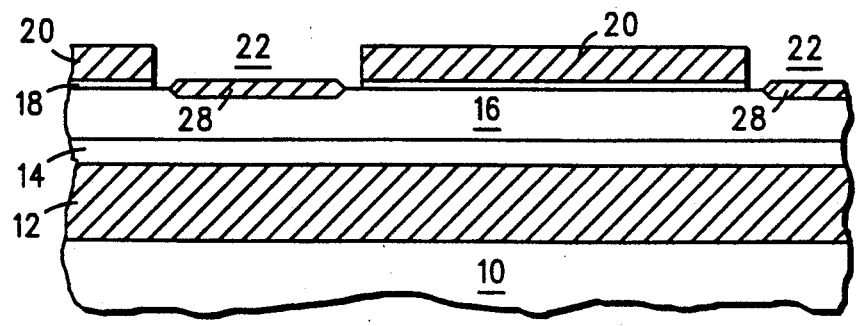
Figure 6:
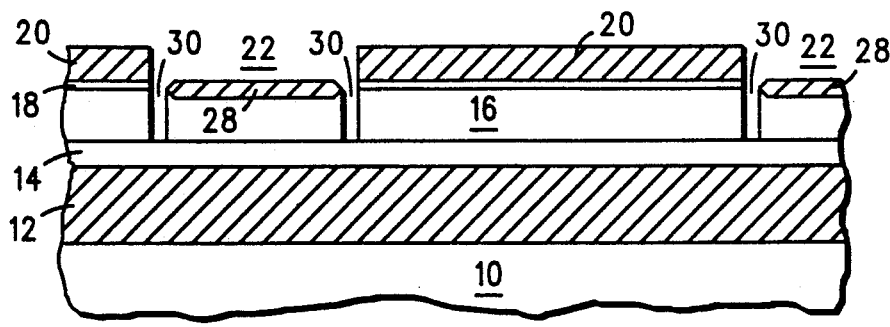
Figure 7:
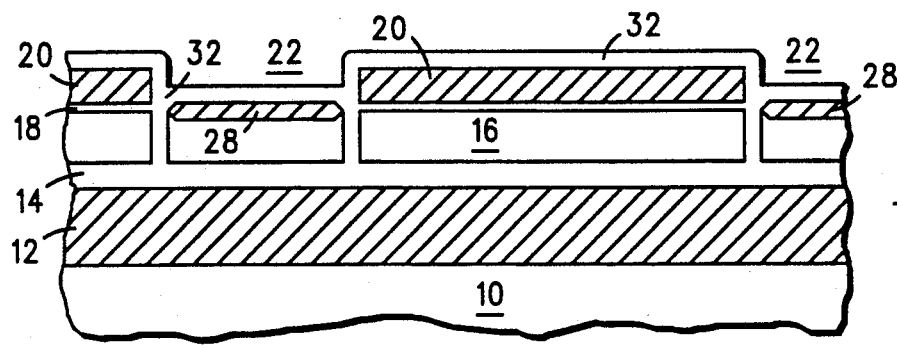
Figure 8:
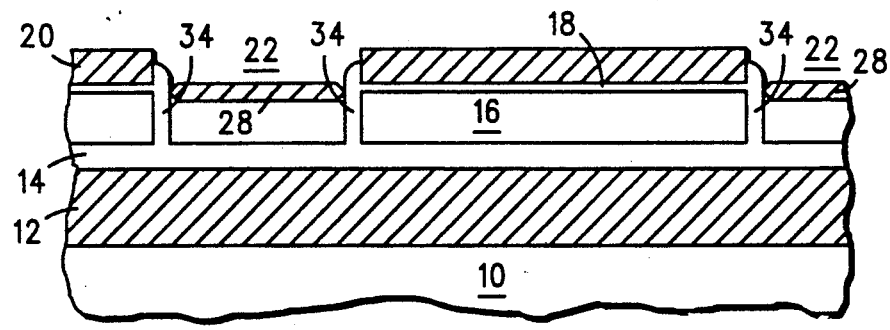
Figure 9:
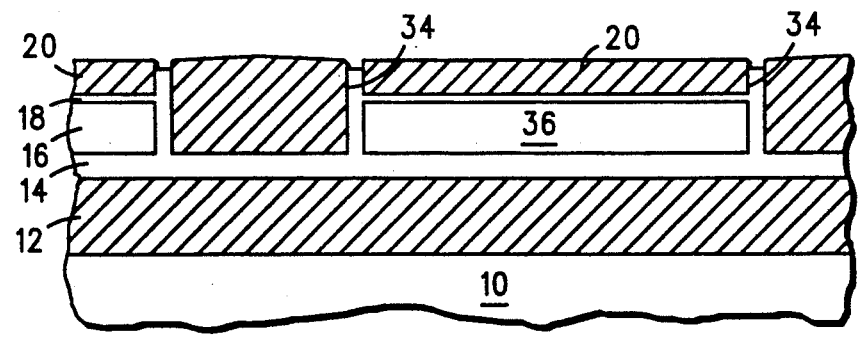
Figure 10:
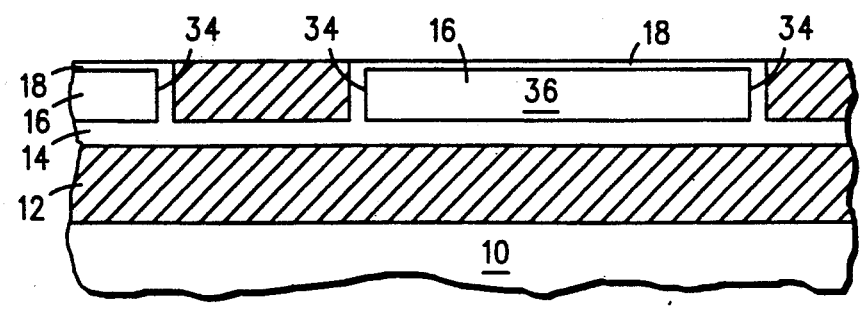
Figure 11:
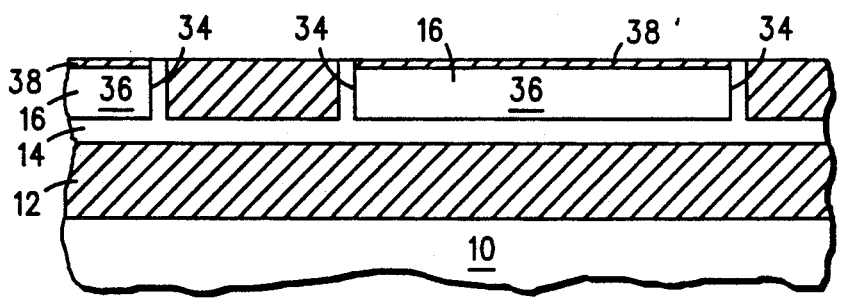

FIGS. 1-3 illustrate highly enlarged cross-sectional views of a portion of a semiconductor structure during processing. Initially, a semiconductor substrate 10 is provided. In this embodiment, semiconductor substrate 10 is comprised of monocrystalline silicon although one skilled in the art will understand that semiconductor substrate 10 may comprise one of many semiconductor materials well known in the art. Of course, it must be understood that the material comprising various other layers of the semiconductor structure must electrically and physically correspond with the material of which semiconductor substrate 10 is comprised.

An isolation oxide layer 12 is then formed on semiconductor substrate 10. Isolation oxide layer 12 is comprised of silicon dioxide in this embodiment. Following the formation of isolation oxide layer 12, an insulating layer 14 is grown thereon. In this embodiment, insulating layer 14 comprises silicon nitride and is deposited on isolation oxide layer 12 by low pressure or plasma enhanced chemical vapor deposition. It is important that insulating layer 14 be impervious to both impurities and oxidation. One skilled in the art will understand that although the preferred embodiment defines a process for forming resistors over isolation oxide, the present invention is equally applicable to the formation of electrodes over active areas. This may be accomplished by eliminating isolation oxide layer 12 and possibly insulating layer 14.

A semiconductor layer 16 is formed following the formation of insulating layer 14. Semiconductor layer 16 comprises polysilicon in this embodiment and is formed by low pressure or plasma enhanced chemical vapor deposition. One skilled in the art will understand that amorphous silicon may also be employed to form semiconductor layer 16. Following the formation of semiconductor layer 16, an insulating layer 18 is formed thereon. Insulating layer 18 is comprised of silicon nitride and is formed by low pressure or plasma enhanced chemical vapor deposition. Again, it is important that insulating layer 18 be impervious to both impurities and oxidation. A dielectric layer 20 is then formed on insulating layer 18. Dielectric layer 20 is comprised of silicon dioxide in this embodiment and may be formed by any suitable process such as low pressure chemical vapor deposition or plasma enhanced chemical vapor deposition.

Openings 22 are formed through dielectric layer 20 and insulating layer 18. Openings 22 extend to semiconductor layer 16 and may be formed by many methods well known in the art although in this embodiment, reactive ion etching is used following the implementation of a mask. After openings 22 have been etched, a sidewall spacer layer 24 is formed on the surface of the device structure. This includes sidewall spacer layer 24 being disposed in openings 22 and on dielectric layer 20. In this embodiment, sidewall spacer layer 24 comprises silicon nitride which is formed by low pressure or plasma enhanced chemical vapor deposition. After its formation, sidewall spacer layer 24 is etched to expose dielectric layer 20 and semiconductor layer 16 in openings 22 except for sidewall spacers 26 which remain in openings 22. In this embodiment, the etch of sidewall spacer layer 24 is performed by reactive ion etching. It should be understood by one skilled in the art that a highly anisotropic etch is required to minimize reduction in the lateral dimension of sidewall spacer 26.

FIGS. 4-11 are highly enlarged cross-sectional views of a portion of a semiconductor structure during processing, the figures depicting one embodiment. Following the formation of sidewall spacers 26 in openings 22, portions of semiconductor layer 16 disposed between sidewall spacers 26 are partially oxidized to form oxidized regions 28 which are relatively thick in this embodiment. The minimum thickness of oxidized regions 28 is defined by the requirement to act as an etch mask for formation of sidewall openings 30 which will be explained presently. This oxidation is generally performed by thermally oxidizing those exposed regions of semiconductor layer 16 between sidewall spacers 26. Once oxidized regions 28 have been formed, sidewall spacers 26 are removed to expose unoxidized portions of semiconductor layer 16 in openings 22. Sidewall spacers 26 are removed in this embodiment by a wet nitride etch.

The exposed regions of semiconductor layer 16 in openings 22 are etched away to expose insulating layer 14 thereby forming sidewall openings 30. Sidewall openings 30 are formed by an anisotropic reactive ion etch of semiconductor layer 16. The formation of sidewall openings in the disclosed manner allows for sidewall openings 30 to be narrower than if formed using photolithography techniques.

Once sidewall openings 30 have been formed, a conformal layer 32 is formed in sidewall openings 30, as well as on the exposed portions of dielectric layer 20 and oxidized regions 28. In this embodiment, conformal layer 32 comprises silicon nitride and is formed by low pressure or plasma enhanced chemical vapor deposition. It is important that the material used to form conformal layer 32 be impervious to both impurities and oxidation. Conformal layer 32 is then etched away leaving only sidewalls 34 which extend above oxidized regions 28. The etch of conformal layer 32 is performed by reactive ion etching. This is followed by completely oxidizing the portions of semiconductor layer 16 which remain beneath oxidized regions 28. In addition to oxidizing these portions, this step also creates a relatively planar structure. It can be seen that semiconductor layer 16 comprises a series of laterally sealed semiconductor regions 36 that are isolated by relatively small isolation regions.

One skilled in the art will understand that it is possible to dope various regions of semiconductor layer 16 at various stages of the disclosed process. It is also possible to dope the various semiconductor regions 36 of semiconductor layer 16 at this time. To do this, the entire device structure is etched back to insulating layer 18. In this embodiment, an unmasked reactive ion etch is used. Once insulating layer 18 has been exposed, dopants may be implanted through insulating layer 18 or insulating layer 18 may be etched away. The latter may be done with a wet etch.

Now that semiconductor regions 36 of semiconductor layer 16 have been exposed, the exposed surfaces are thermally oxidized and a thin screen oxide layer 38 is formed. Screen oxide layer 38 protects the surfaces of semiconductor layer 16 during photolithography and the implantation of impurities. If it is desired that semiconductor regions 36 be completely sealed so that they are impervious to oxidation and impurities, a thin layer of silicon nitride may be deposited over the entire structure. This thin layer may be formed on screen oxide layer 38 or directly on semiconductor layer 16 in place of screen oxide layer 38. The silicon nitride layer will eliminate the loss of dopants during post doping thermal cycles. One skilled in the art will understand that an optional mask may now be employed if more than one impurity level is required. Next, impurity doping and annealing are performed by methods well known in the art.

Figure 12:
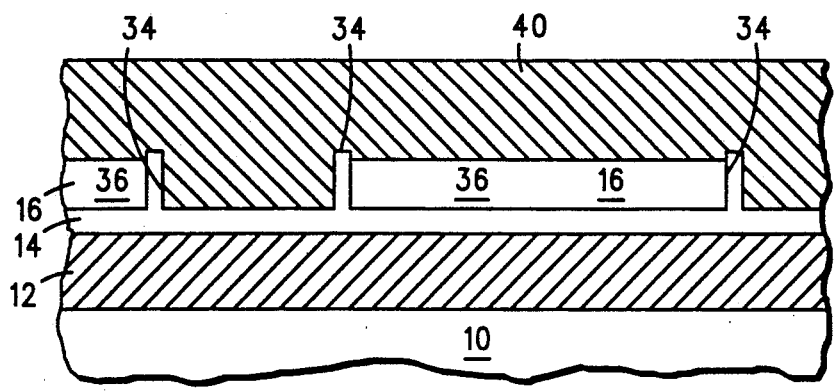
FIGS. 12-13 illustrate highly enlarged cross-sectional views of a portion of a semiconductor structure.
Figure 13:
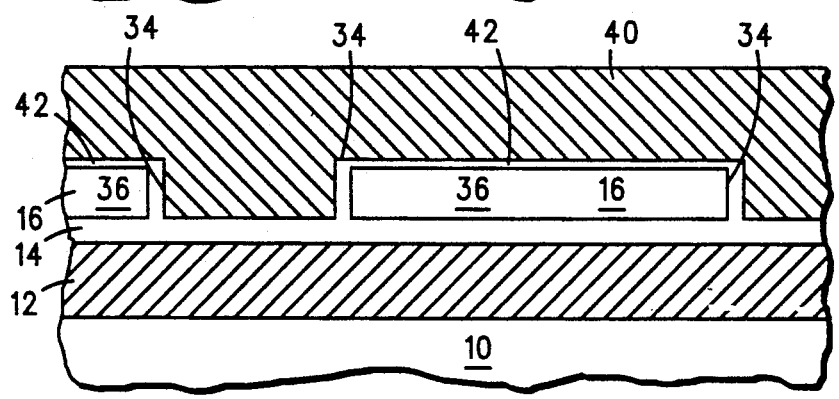
Figure 14:
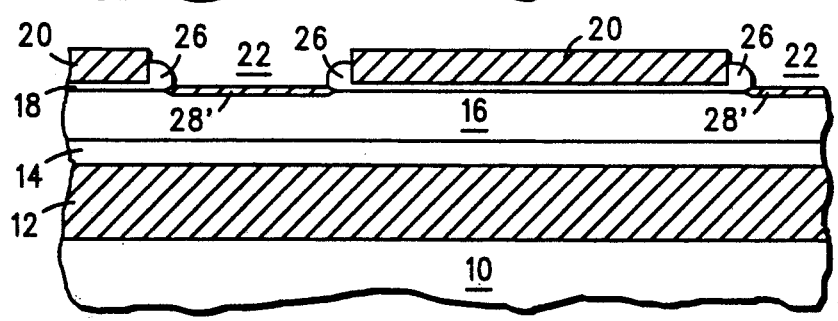
FIGS. 14-18 illustrate highly enlarged cross-sectional views of a portion of a semiconductor structure during processing.
Figure 15:
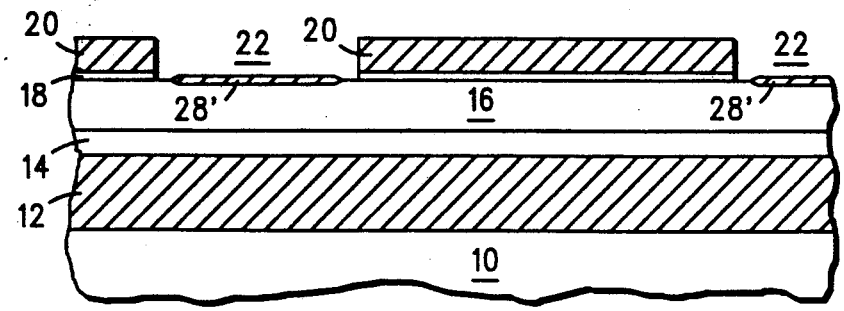
Figure 16:
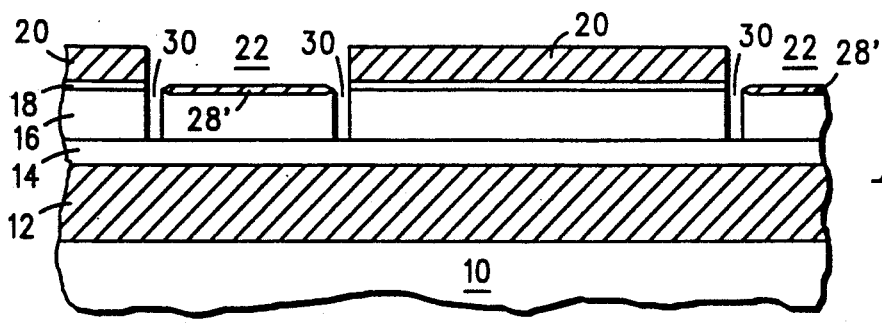
Figure 17:
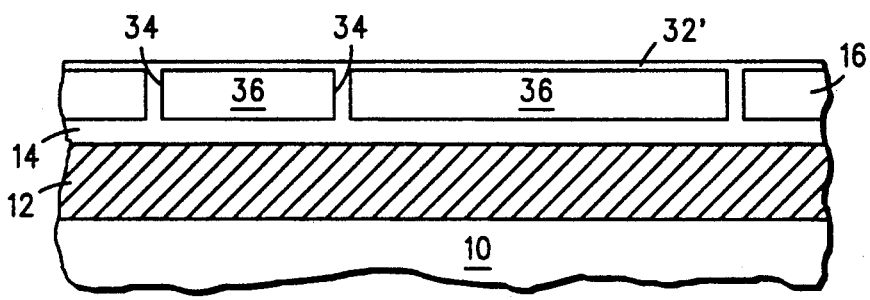
Figure 18:
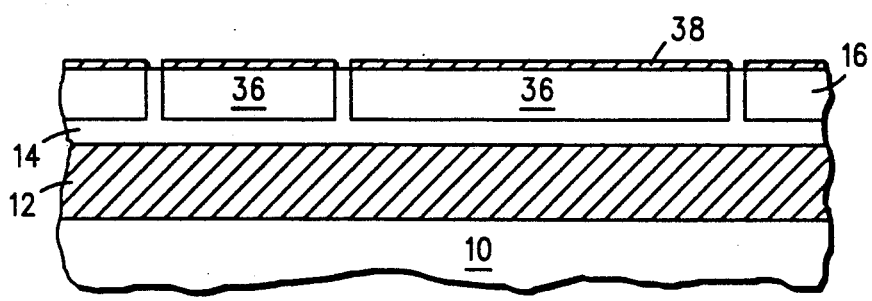

FIGS. 12 and 13 illustrate highly enlarged cross-sectional views of a portion of semiconductor structure. As shown, FIG. 12 includes an oxide layer 40 formed over the entire device structure. Oxide layer 40 serves to insulate semiconductor regions 36 from metallization. As shown in FIG. 13, an encapsulating layer 42, comprised of silicon nitride in this embodiment is disposed on each semiconductor region 36 thereby completely insulating each semiconductor region 36 from the surrounding oxide layers. One skilled in the art will understand that encapsulating layer 42 may be formed by leaving insulating layer 18 (see FIG. 10) in place or by forming a completely new layer on the structure of FIG. 11.

FIGS. 14-18 are highly enlarged cross-sectional views of a portion of a semiconductor structure during processing, the figures depicting another embodiment. Initially, the processing steps are the same as those disclosed earlier and represented by FIGS. 1-3. After sidewall spacers 26 have been formed in openings 22, the portions of semiconductor layer 16 exposed in openings 22 are partially oxidized to form oxidized regions 28'. Oxidized regions 28' are extremely thin as depicted herein. Next, sidewall spacers 26 are etched away as described in the previous embodiment and sidewall openings 30 are formed as previously described.

Once sidewall openings 30 have been formed, dielectric layer 20 and oxidized regions 28' are etched away by methods well known in the art. This is followed by a wet etch of insulating layer 18. Following the wet etch of insulating layer 18, a thin conformal layer 32' is formed in sidewall openings 30 as well as on the exposed portions of semiconductor layer 16. The resulting structure includes a plurality of semiconductor regions 36 separated from each other only by sidewalls 34.

Again, dopants may be implanted into the various semiconductor regions 36 through conformal layer 32' or the regions may have been doped at various stages of the disclosed process. Semiconductor regions 36 may also be doped by removing conformal layer 32' to expose semiconductor regions 36 and thermally oxidizing the exposed surfaces to form a thin screen oxide layer 38. Screen oxide layer 38 will protect semiconductor layer 16 during photolithography and the implantation of impurities. If it is desired that semiconductor regions 36 be completely sealed so that they are impervious to oxidation and impurities, a thin layer of silicon nitride may be deposited over the entire structure as disclosed previously.

Figure 19:
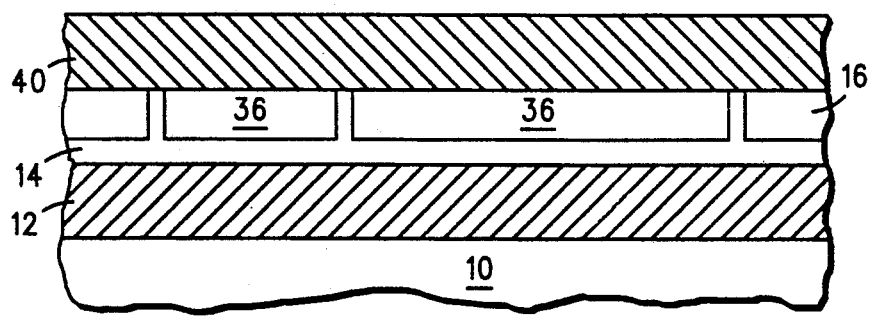
FIGS. 19-20 illustrate highly enlarged cross-sectional views of a portion of a semiconductor structure.
Figure 20:
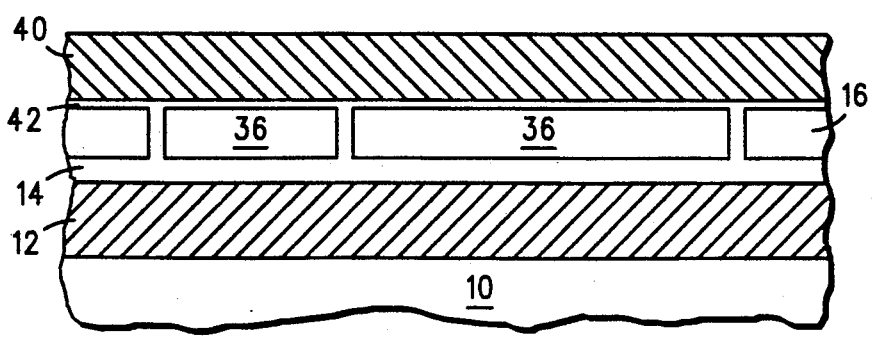

FIGS. 19 and 20 illustrate highly enlarged cross-sectional views of a portion of a semiconductor structure. Both figures include an oxide layer 40 formed over the entire device structure to insulate semiconductor regions 36 from metallization. FIG. 20 includes encapsulating layer 42 that completely isolates and seals each semiconductor region 36 from the surrounding oxide layers. Encapsulating layer 42 may be formed by leaving conformal layer 32' in place or by forming a completely new layer.

Thus it is apparent that there has been provided, in accordance with the invention, an improved semiconductor device having laterally isolated semiconductor regions and a method of fabrication for the device which meet the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A process for sealing and isolating semiconductor within a device structure comprising the steps of:
   providing a semiconductor substrate;
   forming a first insulating layer on said semiconductor substrate;
   forming a semiconductor layer on said first insulating layer;
   forming a first dielectric layer on said semiconductor layer;
   forming openings in said first dielectric layer, said openings extending to said semiconductor layer;
   forming sidewall spacers in said openings;
   partially oxidizing said semiconductor layer between said sidewall spacers;
   removing said sidewall spacers to expose unoxidized portions of said semiconductor layer in said openings;
   etching completely through said exposed, unoxidized portions of said semiconductor layer to form sidewall openings; and
   forming sidewalls in said sidewall openings, said sidewalls being impervious to impurities and oxidation.

2. The process of claim 1 further comprising the step of completely oxidizing the semiconductor layer remaining in the openings following the forming sidewalls step.

3. The process of claim 1 wherein the partially oxidized portions of the semiconductor layer in the openings are removed along with the first dielectric layer following the formation of the sidewall openings and a second dielectric layer is subsequently formed on the structure.

4. The process of claim 1 further comprising the step of forming a second insulating layer on said semiconductor regions, said second insulating layer being impervious to impurities and oxidation.

5. The process of claim 4 wherein the first insulating layer is impervious to impurities and oxidation.

6. The process of claim 5 further comprising the step of forming an isolating layer between the semiconductor substrate and the first insulating layer.

7. The process of claim 6 wherein the semiconductor substrate comprises silicon, the semiconductor regions comprise amorphous or polycrystalline silicon, the insulating sidewalls and layers comprise silicon nitride and the isolating layer comprises silicon dioxide.

8. A process for sealing and isolating semiconductor regions in a device structure comprising the steps of:
   providing a semiconductor substrate;
   forming a first insulating layer on said semiconductor substrate;
   forming a semiconductor layer on said first insulating layer;
   forming a second insulating layer on said semiconductor layer, said second insulating layer being comprised of a first dielectric material that is impervious to impurities and oxidation;
   forming a dielectric layer comprised of a second dielectric material on said second insulating layer;
   forming openings through said dielectric and second insulating layers, said openings extending to said semiconductor layer;
   forming sidewall spacers comprised of said first dielectric material in said openings;
   partially oxidizing said semiconductor layer between said sidewall spacers;
   removing said sidewall spacers from said openings to expose unoxidized portions of said semiconductor layer;
   etching completely through said exposed, unoxidized portions of said semiconductor layer to form sidewall openings;
   forming sidewalls in said sidewall openings, said sidewalls being comprised of said first dielectric material;
   completely oxidizing said semiconductor layer remaining in said openings; and
   etching said entire device structure back to said insulating layer.

9. The process of claim 8 further comprising the steps of:
   completely removing the second insulating layer;
   oxidizing the exposed surfaces of the semiconductor layer; and
   doping the various regions of said semiconductor layer.

10. The process of claim 8 wherein an isolating layer comprised of the second dielectric material is formed on the entire device structure.

11. The process of claim 8 wherein the first insulating layer comprises the first dielectric material.

12. The process of claim 11 wherein an isolation layer comprised of the second dielectric material is formed between the semiconductor substrate and the first insulating layer disposed beneath the semiconductor layer.

13. The process of claim 1 wherein the semiconductor substrate comprises silicon, the semiconductor layer comprises amorphous or polycrystalline silicon, the first dielectric material comprises silicon nitride and the second dielectric material comprises silicon dioxide.

14. A process for sealing and isolating semiconductor regions in a device structure comprising the steps of:
   providing a silicon substrate;
   forming a first silicon nitride insulating layer on said silicon substrate;
   forming a polysilicon layer on said first silicon nitride insulating layer;
   forming a second silicon nitride insulating layer on said polysilicon layer;
   forming a silicon dioxide layer on said second silicon nitride insulating layer;
   etching openings through said silicon dioxide layer and said second silicon nitride insulating layer, said openings extending to said polysilicon layer;
   forming a silicon nitride sidewall spacer layer on said silicon dioxide layer and in said openings;
   patterning and etching said silicon nitride sidewall spacer layer to form sidewall spacers in said openings;
   partially oxidizing said polysilicon layer in said openings between said sidewall spacers;
   removing said sidewall spacers to expose unoxidized portions of said polysilicon layer in said openings;
   etching completely through said exposed, unoxidized portions of said polysilicon layer in said openings to form sidewall openings;
   forming a silicon nitride conformal layer in said sidewall openings, in said openings and on said silicon dioxide layer;
   removing said silicon nitride conformal layer from said silicon dioxide layer and said oxidized polysilicon layer in said openings;
   completely oxidizing said polysilicon layer in said openings; and
   etching said entire device structure back to said second silicon nitride insulating layer.

15. The process of claim 14 further comprising the steps of:
   completely removing the second silicon nitride insulating layer;
   thermally oxidizing the exposed surfaces of the polysilicon layer; and
   doping the various regions of said polysilicon layer.

16. The process of claim 14 wherein a silicon dioxide isolating layer is formed on the entire device structure.

17. The process of claim 14 wherein a silicon dioxide isolating layer is formed between the silicon substrate and the first silicon nitride insulating layer.

18. A process for sealing and isolating semiconductor regions in a device structure comprising the steps of:
   providing a semiconductor substrate;
   forming a first insulating layer on said semiconductor substrate;
   forming a semiconductor layer on said first insulating layer;
   forming a second insulating layer on said semiconductor layer, said insulating layer being comprised of a first dielectric material that is impervious to impurities and oxidation;
   forming a dielectric layer comprised of a second dielectric material on said second insulating layer;
   forming openings through said dielectric and second insulating layers, said openings extending to said semiconductor layer;
   forming sidewall spacers comprised of said first dielectric material in said openings;
   partially oxidizing said semiconductor layer between said sidewall spacers;
   removing said sidewall spacers from said openings to expose unoxidized portions of said semiconductor layer;
   etching completely through said exposed unoxidized portions of said semiconductor layer to form sidewall openings;
   removing said partially oxidized portions of said semiconductor layer and said dielectric layer; and
   forming sidewalls in said sidewall openings, said sidewalls being comprised of said first dielectric material.

19. The process of claim 18 further comprising the steps of:
   completely removing the second insulating layer;
   oxidizing the exposed surfaces of the semiconductor layer; and
   doping the various regions of said semiconductor layer.

20. The process of claim 18 wherein an isolating layer comprised of the second dielectric material is formed on the entire device structure.

21. The process of claim 18 wherein the first insulating layer comprised of the first dielectric material.

22. The process of claim 21 wherein an isolation layer comprised of the second dielectric material is formed between the semiconductor substrate and the first insulating layer disposed beneath the semiconductor layer.

23. The process of claim 21 wherein the semiconductor substrate comprises silicon, the semiconductor layer comprises amorphous or polycrystalline silicon, the first dielectric material comprises silicon nitride and the second dielectric material comprises silicon dioxide.

24. A process for sealing and isolating semiconductor regions in a device structure comprising the steps of:
   providing a silicon substrate;
   forming a first silicon nitride insulating layer on said silicon substrate;
   forming a polysilicon layer on said first silicon nitride insulating layer;
   forming a second silicon nitride insulating layer on said polysilicon layer,
   forming a silicon dioxide layer on said silicon nitride insulating layer;
   patterning and etching openings through said silicon dioxide layer and said second silicon nitride insulating layer, said openings extending to said polysilicon layer;
   forming a silicon nitride sidewall spacer layer on said silicon dioxide layer and in said openings;
   patterning and etching said silicon nitride sidewall spacer layer to form sidewall spacers in said openings;
   partially oxidizing said polysilicon layer in said openings btween said sidewall spacers;
   removing said sidewall spacers to expose unoxidized portions of said polysilicon layer in said openings;
   etching completely through said exposed, unoxidized portions of said polysilicon layer in said openings to form sidewall openings;

removing said partially formed oxidized portions of said polysilicon layer and said silicon dioxide layer; and forming a silicon nitride conformal layer in said sidewall openings and on said second silicon nitride insulating layer.

25. The process of claim 24 further comprising the steps of:

completely removing the second silicon nitride insulating layer and conformal layer from the top of the polysilicon layer;

thermally oxidizing the exposed surfaces of said polysilicon layer; and doping the various regions of said polysilicon layer.

26. The process of claim 24 wherein a silicon dioxide isolating layer is formed on the entire device structure.

27. The process of claim 24 wherein a silicon dioxide isolating layer is formed between the silicon substrate and the first silicon nitride insulating layer.

* * * * *